United States Patent
Chang et al.

(10) Patent No.: US 7,561,656 B2
(45) Date of Patent: Jul. 14, 2009

(54) SHIFT REGISTER WITH LOW STRESS

(75) Inventors: Lee-hsun Chang, Hsin-Chu (TW); Yu-wen Lin, Hsin-Chu (TW); Yung-tse Cheng, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 11/682,223

(22) Filed: Mar. 5, 2007

(65) Prior Publication Data

US 2008/0056430 A1    Mar. 6, 2008

(30) Foreign Application Priority Data

Sep. 1, 2006  (TW)  .............................. 95132507 A (51) Int. Cl.
*G11C 19/00* (2006.01)
(52) U.S. Cl. ............................... 377/64; 377/68; 377/74
(58) Field of Classification Search .................... 377/64, 377/68–81
See application file for complete search history.

(56) References Cited

U.S. PATENT DOCUMENTS

| | | | | |
|---|---|---|---|---|
| 7,233,308 | B2 * | 6/2007 | Park ............................. | 345/100 |
| 2003/0231735 | A1 * | 12/2003 | Moon et al. .................... | 377/64 |
| 2004/0028172 | A1 * | 2/2004 | Yu ............................... | 377/64 |
| 2006/0146978 | A1 * | 7/2006 | Jang ............................. | 377/64 |
| 2006/0269038 | A1 * | 11/2006 | Jang et al. ..................... | 377/64 |
| 2007/0217563 | A1 * | 9/2007 | Chang et al. ................... | 377/64 |

\* cited by examiner

*Primary Examiner*—Tuan Lam (57) ABSTRACT

A shift register includes a plurality of register stages. Each register stage includes an output circuit, a first switching circuit and a second switching circuit. The output circuit is capable of outputting a first driving signal. The first switching circuit is used to pull down the output circuit into a low voltage level when the output circuit is not outputting the first driving signal. The second switching circuit is capable of receiving an input signal. The first switching circuit holds electric charges by the parasitical capacitor resident in the transistor in order to keep the first switching circuit in a turn-on state when the output circuit is not outputting the first driving signal.

3 Claims, 15 Drawing Sheets

ABSTRACT# SHIFT REGISTER WITH LOW STRESS

FIELD OF THE INVENTION

The present invention relates to a shift register with low stress, and more particularly, to a shift register using resident charges of a transistor for decreasing stress and AC coupling.

BACKGROUND OF THE INVENTION

Nowadays, the consumer electronic products are generally provided with an advanced display as a basic device. A liquid crystal display (LCD) with high resolution and colorful screen has been commonly used in the consumer electronic products, such as cellular phone, digital camera, computer monitor, or laptop PC.

Figure 1:
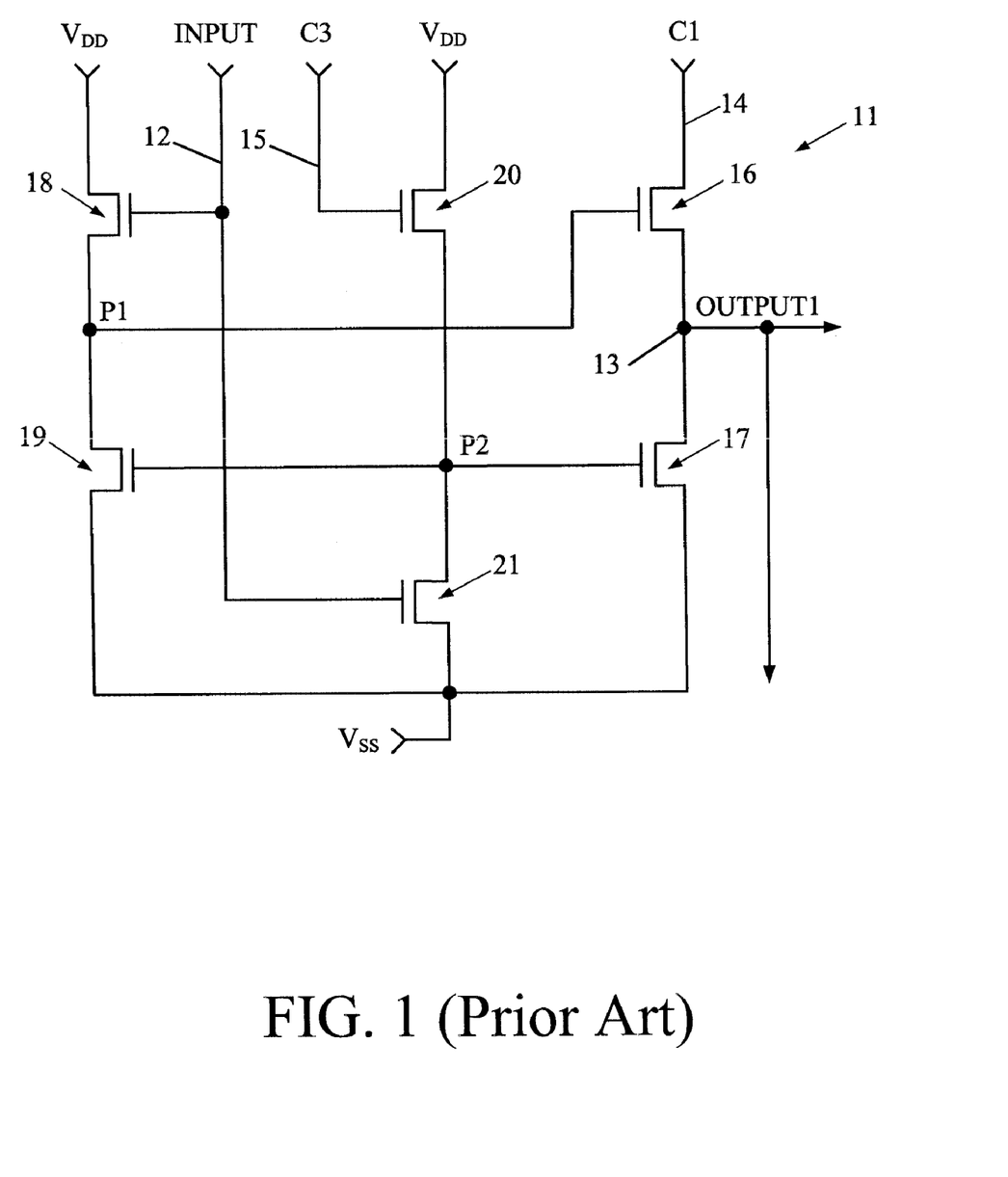
FIG. 1 is a circuit diagram of a stage of shift register in a conventional LCD.
Figure 2:
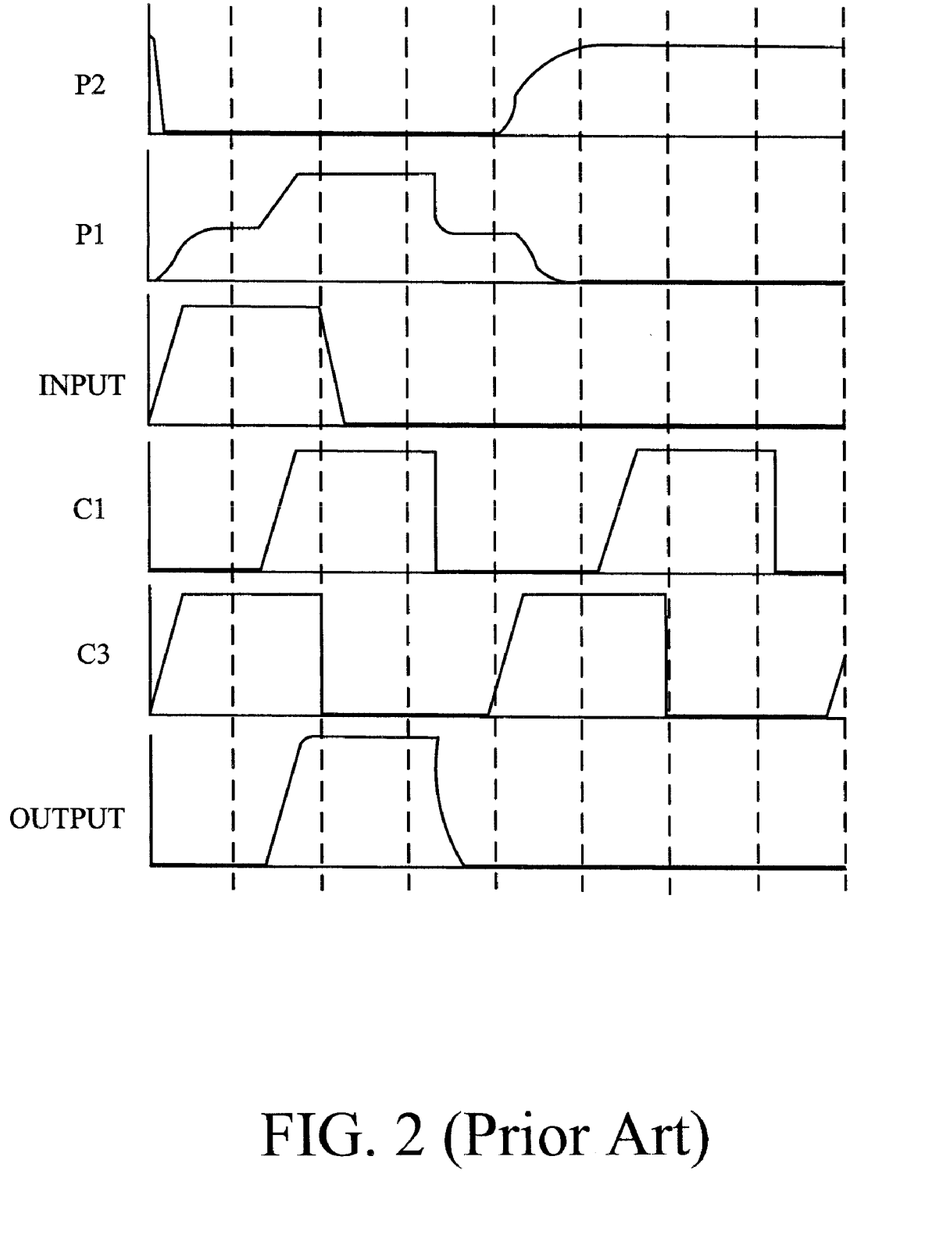
FIG. 2 is a signal waveform diagram of each node in the conventional shift register.

A shift register is an essential part of a driving circuit in the LCD panel. The shift register is used to drive a plurality of stages of displaying circuit in the LCD panel. Hence, the quality of circuit design for the shift register determines the performance of the LCD panel. Referring to FIG. 1, a circuit diagram of a stage of shift register 11 in a conventional LCD is shown. The shift register 11 includes a plurality of transistors 16, 17, 18, 19, 20, and 21 for controlling an output signal OUTPUT1 according to clock signals C1 and C2. Further referring to FIG. 2, a signal waveform diagram of each node in the shift register 11 is shown. The transistor 20 is turned on when the clock signal C1 is in a high voltage level, thereby an node P2 is in a $V_{DD}$ voltage (high voltage level) for turning on the transistors 17 and 19 simultaneously. Therefore, the voltage levels of the gate (i.e. the node P1) and source of the transistor 16 are both pulled down to a $V_{SS}$ voltage (low voltage level).

Although the shift register 11 of conventional LCD can rapidly pull down the voltage levels of the gate and source of the transistor 16 to the $V_{SS}$ voltage, the DC voltage source $V_{DD}$ is required to be provided in the shift register 11. The transistors 18 and 20 may be induced a stress by connecting to the DC voltage source $V_{DD}$ all the time. Furthermore, the present shift register circuit design of LCD is required to be provided without the DC voltage source $V_{DD}$ for reducing manufacturing costs and improving device performance. Therefore, there is a need to provide a novel shift register without the DC voltage source $V_{DD}$ to resolve the above problems in conventional LCDs.

SUMMARY OF THE INVENTION

It is an object of the present invention to provide a shift register using resident charges of a transistor for decreasing stress and AC coupling.

To achieve the above object, the present invention provides a shift register which comprises a plurality of register stages. Each register stage includes an output circuit, a first switching circuit and a second switching circuit. The output circuit is capable of outputting a first driving signal. The first switching circuit is used to pull down the output circuit into a low voltage level when the output circuit is not outputting the first driving signal. The second switching circuit is capable of receiving an input signal. The first switching circuit holds electric charges by the parasitical capacitor resident in the transistor in order to keep the first switching circuit in a turn-on state when the output circuit is not outputting the first driving signal.

The shift register according to the present invention uses the resident charges of the transistor for decreasing stress in transistors and the AC coupling of the driving signals. Moreover, the shift register in accordance with the present invention does not need to set an additional DC voltage source $V_{DD}$. Hence, the manufacturing costs can be reduced and the device performance can be improved.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE PREFERRED EMBODIMENTS

Figure 3:
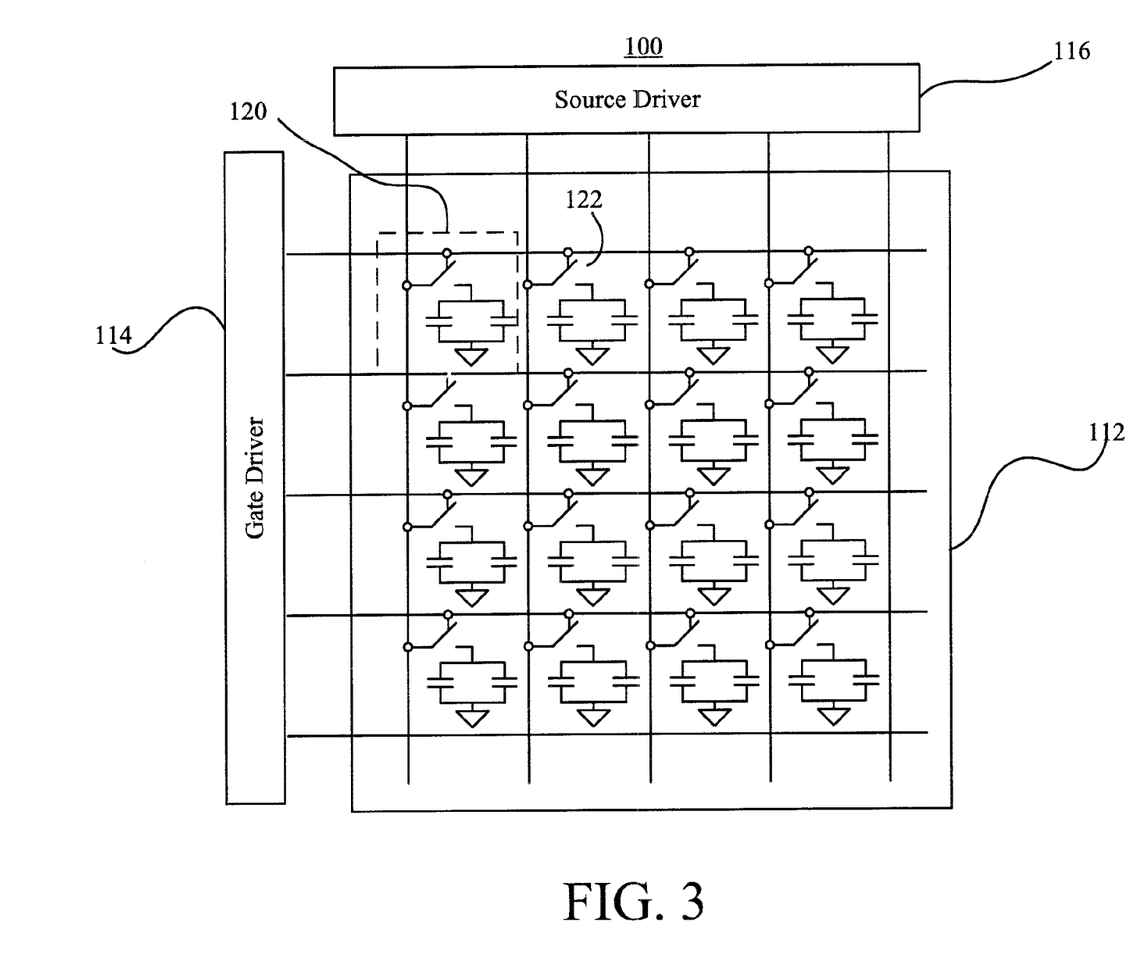
FIG. 3 is a block diagram of an LCD.

FIG. 3 illustrates a block diagram of an LCD 100. The LCD 100 comprises an LCD panel 112, a gate driver 114 and a source driver 116. The LCD panel 112 comprises a plurality of pixels, each pixel includes three pixel units 120 for respectively representing three primary colors (i.e., red, green and blue). The gate driver 114 outputs scanning signals to turn on corresponding transistors of each row in sequence, in the meantime, the source driver 116 outputs corresponding data signals to the pixel units 120 of each row in order to charge the pixel units 120 to reach the required voltage levels thereof for displaying corresponding gray levels. The scanning signals are disabled by the gate driver 114 until the pixel units 120 of a single row are completely charged, then the gate driver 114 outputs next scanning signals to turn on the transistors 120 of next row and the pixel units 120 of the next row are charged by the source driver 116. The pixel units 120 of each row are charged in sequence until all the pixel units 120 of the LCD panel 112 are completely charged, then the charge sequence is restarted from the first row repeatedly. In the present LCD panel, the control circuit of the gate driver 114 comprises a shift register, which is used to periodically output the scanning signals to the LCD panel 112.

Figure 4:
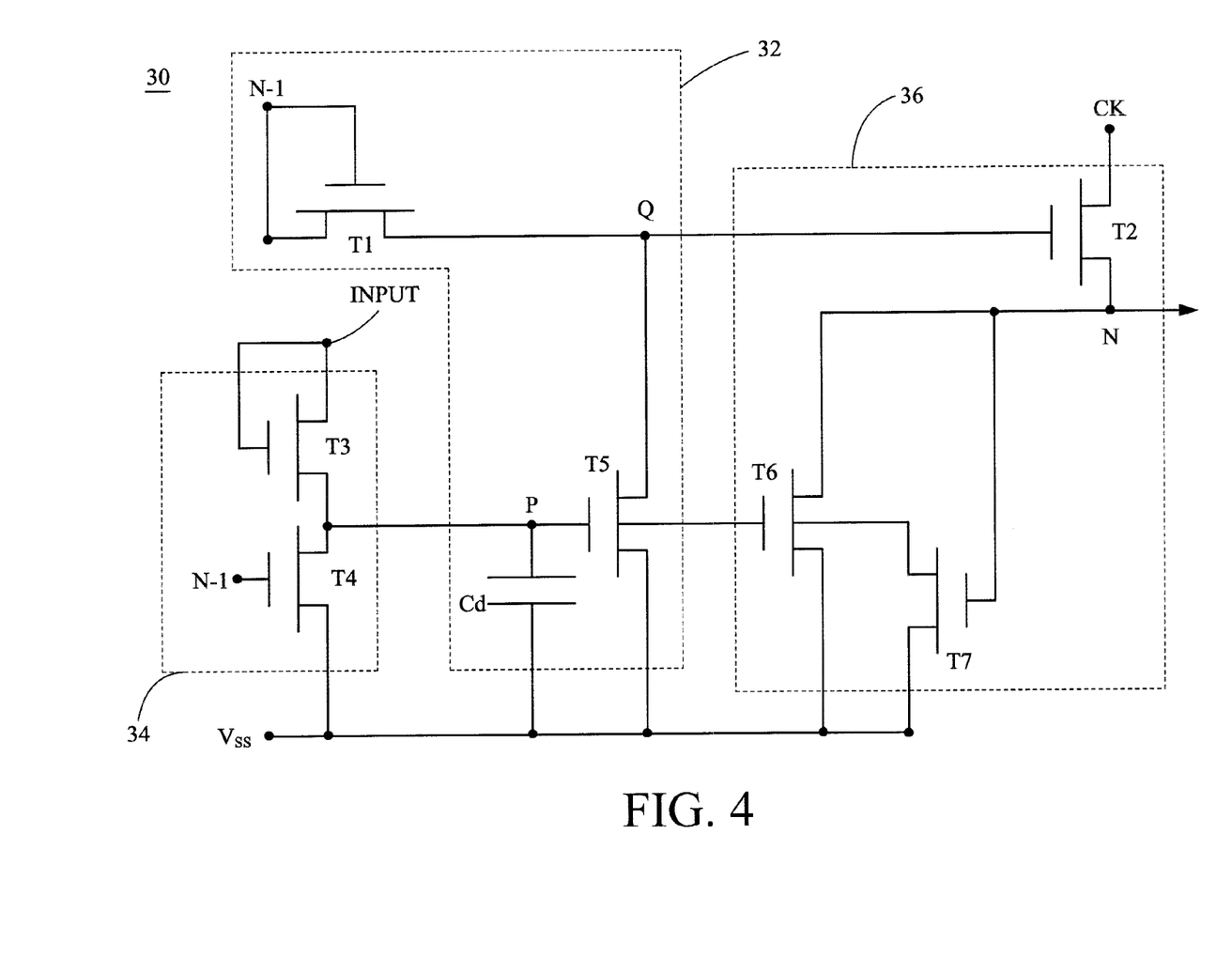
FIG. 4 is a circuit diagram of a single stage of a shift register according to the present invention.

FIG. 4 illustrates a circuit diagram of a single stage of a shift register 30 according to the present invention. The shift register 30 is applied in an LCD apparatus to implement the above-mentioned control circuit of gate driver. The shift register 30 comprises a first switch circuit 32, a second switch circuit 34, and an output circuit 36. The first switch circuit 32 comprises the transistors T3 and T4. The second switch circuit 34 comprises the transistors T1 and T5. The output circuit 36 comprises the transistors T2, T6 and T7. The transistor T1 has a gate and a drain for receiving a driving signal N−1 of a stage N−1 and a source connecting to a node Q. The transistor T5 has a gate connecting to a node P, a drain connecting to the node Q, and a source connecting to a low voltage level $V_{SS}$. In general, the low voltage level $V_{SS}$ approaches a ground voltage. The gate and drain of transistor T3 receive an input signal INPUT which can be a first clock signal CK, a second clock signal XCK or a driving signal N+1 of a stage N+1, and the source of transistor T3 is connected to the node P. The gate of transistor T4 receives the driving signal N−1 of the stage N−1. The drain of transistor T4 is connected to the node Q. The source of transistor T4 is connected to the low voltage level $V_{SS}$. The gate of transistor T2 is connected to the node Q. The drain of transistor T2 receives the first clock signal CK. The source of transistor T2 receives the driving signal N of the stage N. The gate of transistor T6 is connected to the node P. The drain of transistor T6 is connected with the source of transistor T2. The source of transistor T6 is connected to the low voltage level $V_{SS}$. The gate of transistor T7 is connected with the source of transistor T2. The drain of transistor T7 is connected to the node P. The source of transistor T7 is connected to the low voltage level $V_{SS}$.

Figure 5:
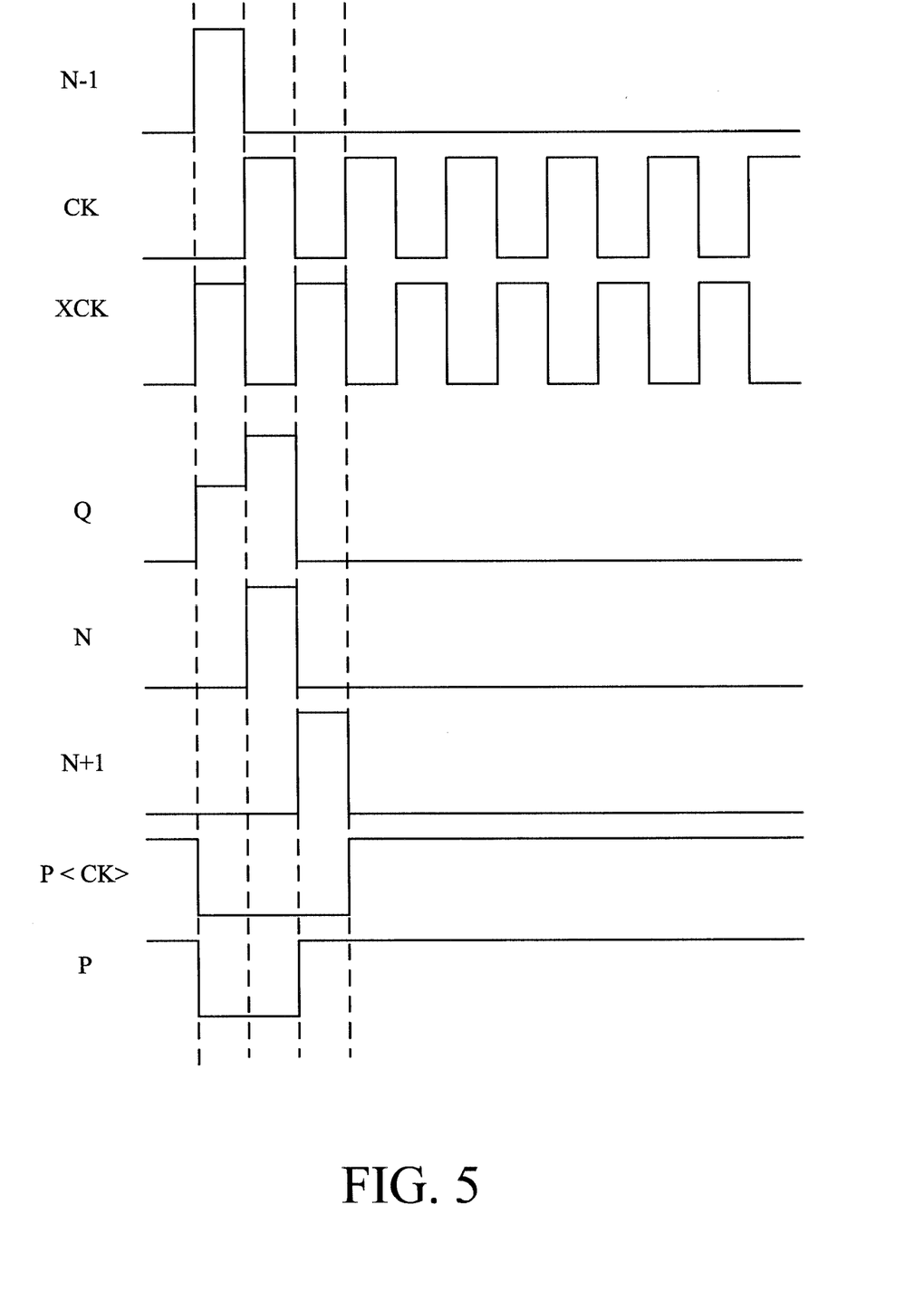
FIG. 5 is a signal waveform diagram of each node in the shift register of FIG. 4.

Referring to FIG. 5, a signal waveform diagram of each node in the shift register 30 is shown. A parasitical capacitance is resident in each transistor T5 and T6. It means that a equivalent capacitor $C_d$ can be treated as connecting between the node P and the low voltage level $V_{SS}$. The capacitor $C_d$ is capable of continuously storing charges from the node P after the shift register 30 is activated. Accordingly, the node P can be kept in a high voltage level constantly. The transistors T5 and T6 can be kept in a turn-on state as the node P is kept in the high voltage level, and therefore the voltage levels of the gate and source of transistor T2 can be pulled down to the low voltage level $V_{SS}$. Accordingly, the input signal INPUT received by the gate and drain of transistor T3 can keep the node P in the high voltage level constantly, wherein the input signal INPUT may be the first clock signal CK, the second clock signal XCK or the driving signal N+1 of stage N+1. However, the transistor T7 is used to pulled down the voltage level of the node P to the low voltage level $V_{SS}$ when the input signal INPUT uses the first clock signal CK or the driving signal N+1 and a driving signal N of a stage N is needed to be in the high voltage level, it means that the transistors T5 and T6 are required to be turned off in order to keep the source of transistor T2 in the high voltage level in the meantime. Contrarily, the transistor T4 is used to pulled down the voltage level of the node P to the low voltage level $V_{SS}$ when the input signal INPUT uses the second clock signal XCK.

Figure 6:
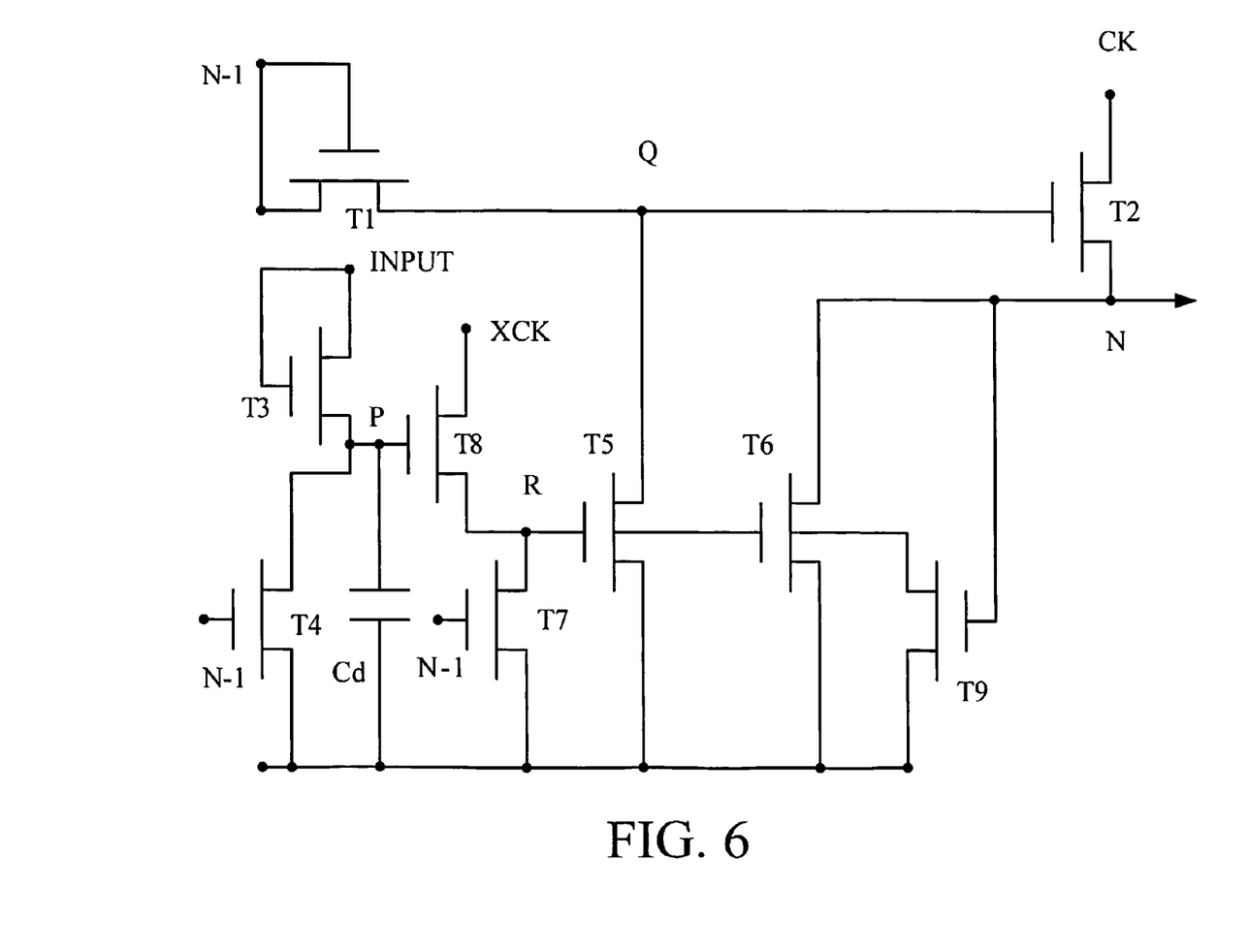
FIG. 6 is a circuit diagram of another embodiment of the shift register according to the present invention.

FIG. 6 illustrates a circuit diagram of another embodiment of the shift register according to the present invention. The shift register 50 is similarly to the above-mentioned shift register 30 except that the first switch circuit 52 of the shift register 50 further comprises the transistors T8 and T9. The transistor T8 has a gate connecting to the node P, a drain for receiving the second clock signal XCK, and a source connecting to a node R. The transistor T9 has a gate for receiving the driving signal N−1 of stage N−1, a drain connecting to the node R, and a source connecting to the low voltage level $V_{SS}$.

Furthermore, the gates of transistors T5 and T6 are changed to connect with the node R, and the gate and drain of transistor T3 is changed to receive the driving signal N of stage N.

Figure 7:
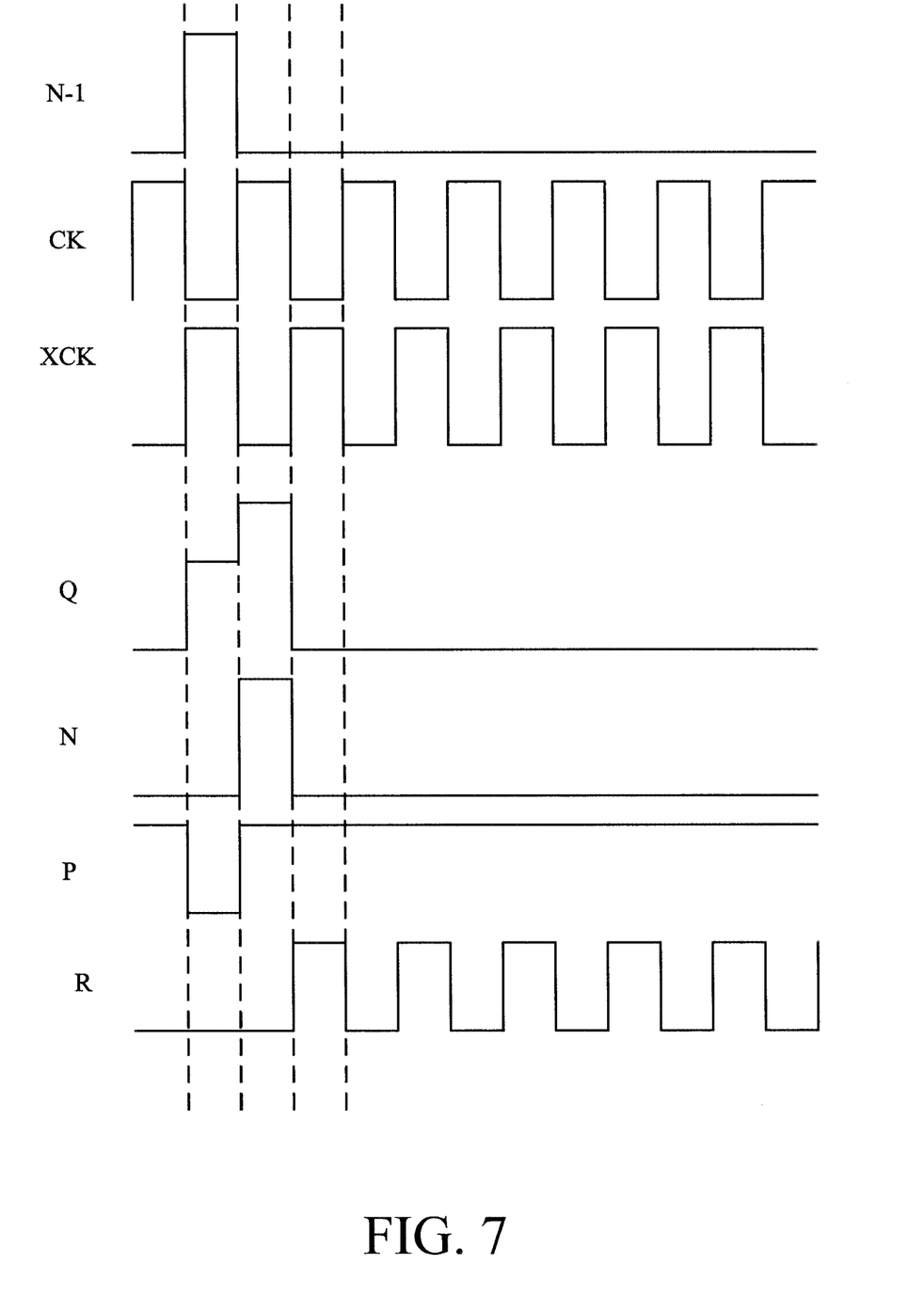
FIG. 7 is a signal waveform diagram of each node in the shift register of FIG. 6.

FIG. 7 shows a signal waveform diagram of each node in the shift register 50. The equivalent capacitor $C_d$ in FIG. 6 is the parasitical capacitance of transistor T8. The node P can be kept in the high voltage level constantly by the charges stored in the equivalent capacitor $C_d$. The transistor T8 can be kept in a turn-on state to make the voltage level of the node R synchronized with the second clock signal XCK. Accordingly, the turn-on/turn-off state of the transistors T5 and T6 can be controlled for synchronously controlling the voltage levels of the gate and source of transistor T2. However, the transistors T4 and T9 are used to discharge the equivalent capacitor $C_d$ for turning off the transistor T8 when the driving signal N−1 is in the high voltage level.

Figure 8:
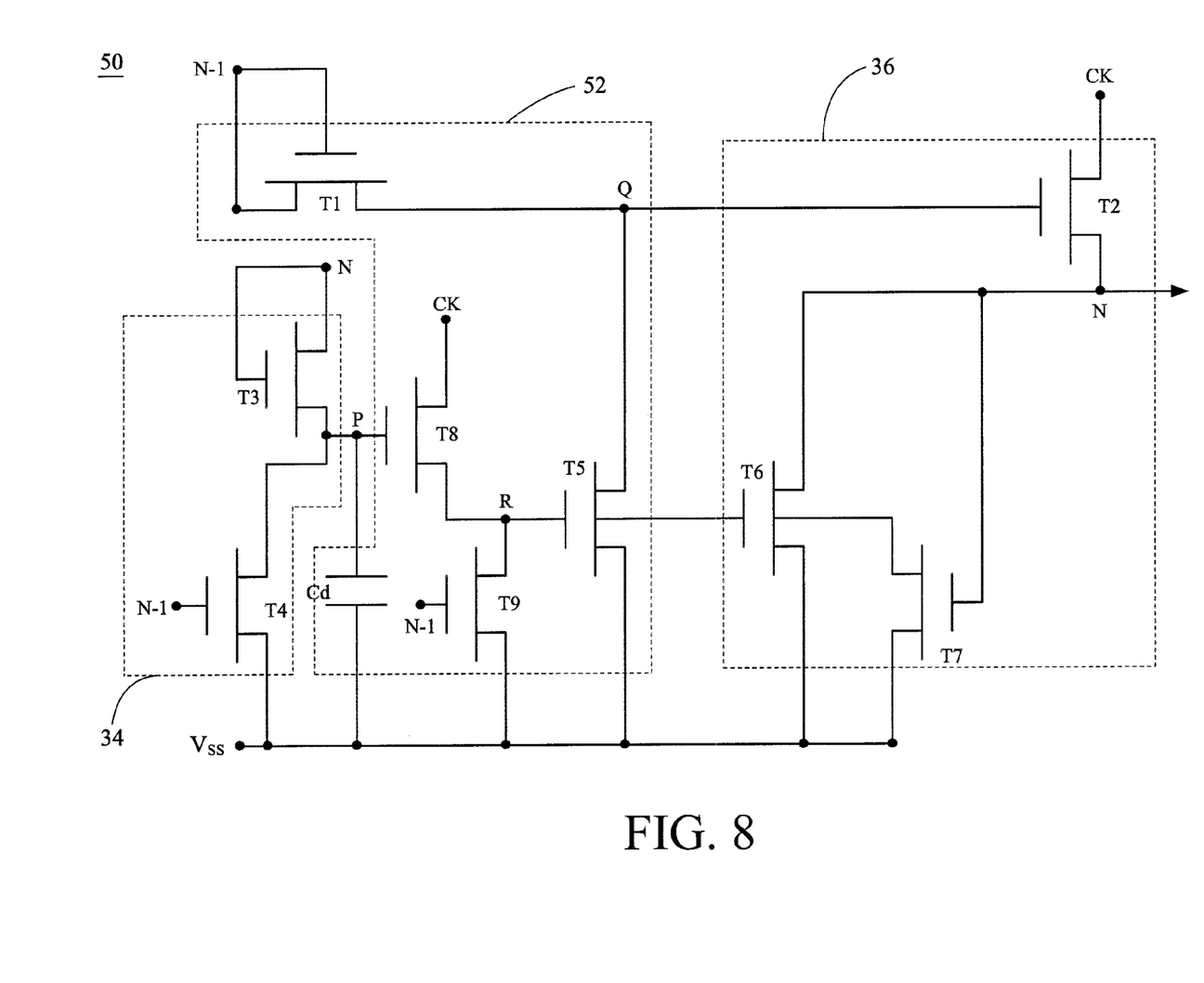
FIG. 8 is a circuit diagram of a further embodiment of the shift register according to the present invention.
Figure 9:
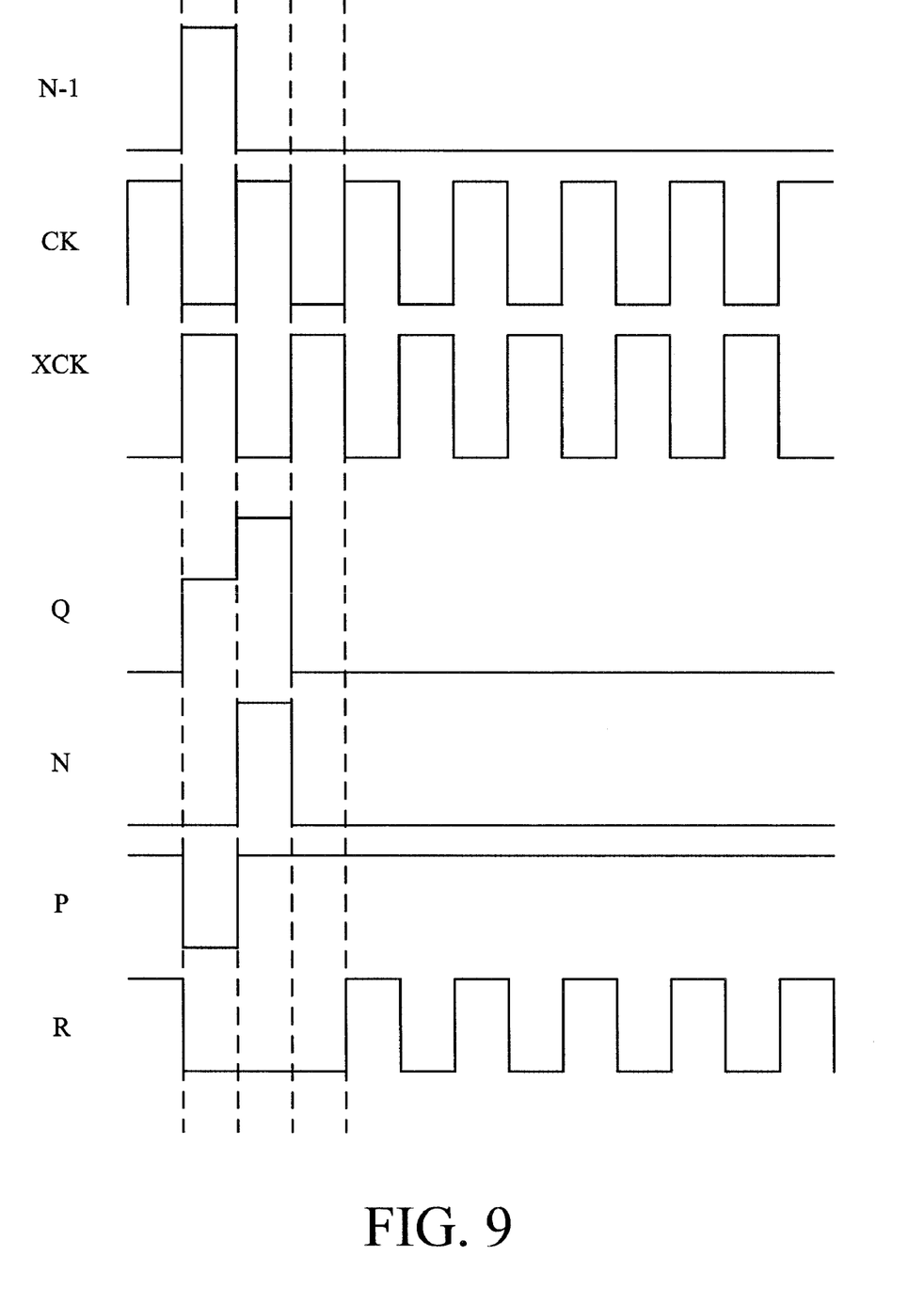
FIG. 9 is a signal waveform diagram of each node in the shift register of FIG. 8.

FIG. 8 illustrates a circuit diagram of a further embodiment of the shift register according to the present invention. The difference between the embodiments in FIG. 8 and FIG. 6 is that the drain of transistor T8 in the shift register 50 is changed to receive the first clock signal CK. FIG. 9 illustrates a signal waveform diagram of each node in the shift register 50 of FIG. 8. The equivalent capacitor $C_d$ in FIG. 8 is the parasitical capacitance of transistor T8. The node P can be kept in the high voltage level constantly by the charges stored in the equivalent capacitor $C_d$. The transistor T8 can be kept in a turn-on state to make the voltage level of the node R synchronized with the first clock signal CK. Accordingly, the turn-on/turn-off state of the transistors T5 and T6 can be controlled for synchronously controlling the voltage levels of the gate and source of transistor T2. However, the transistors T4 and T9 are used to discharge the equivalent capacitor $C_d$ for turning off the transistor T8 when the driving signal N−1 is in the high voltage level.

Figure 10:
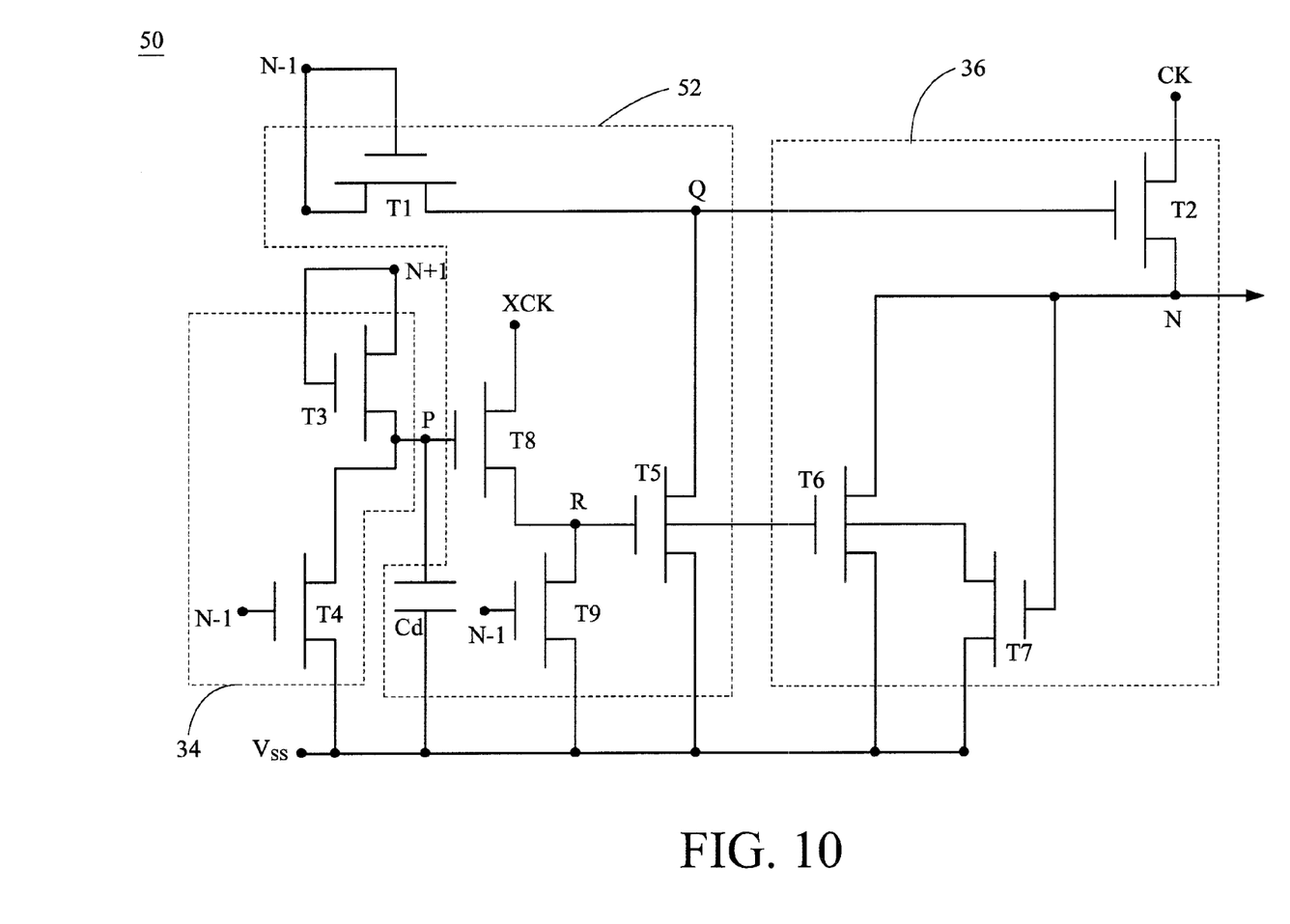
FIG. 10 is a circuit diagram of a still further embodiment of the shift register according to the present invention.

FIG. 10 illustrates a circuit diagram of a still further embodiment of the shift register according to the present invention. The difference between the embodiments in FIG. 10 and FIG. 8 is that the drain of transistor T8 in the shift register 50 is changed to receive the second clock signal XCK and the gate and drain of transistor T3 are changed to receive the driving signal N+1 of the stage N+1.

Figure 11:
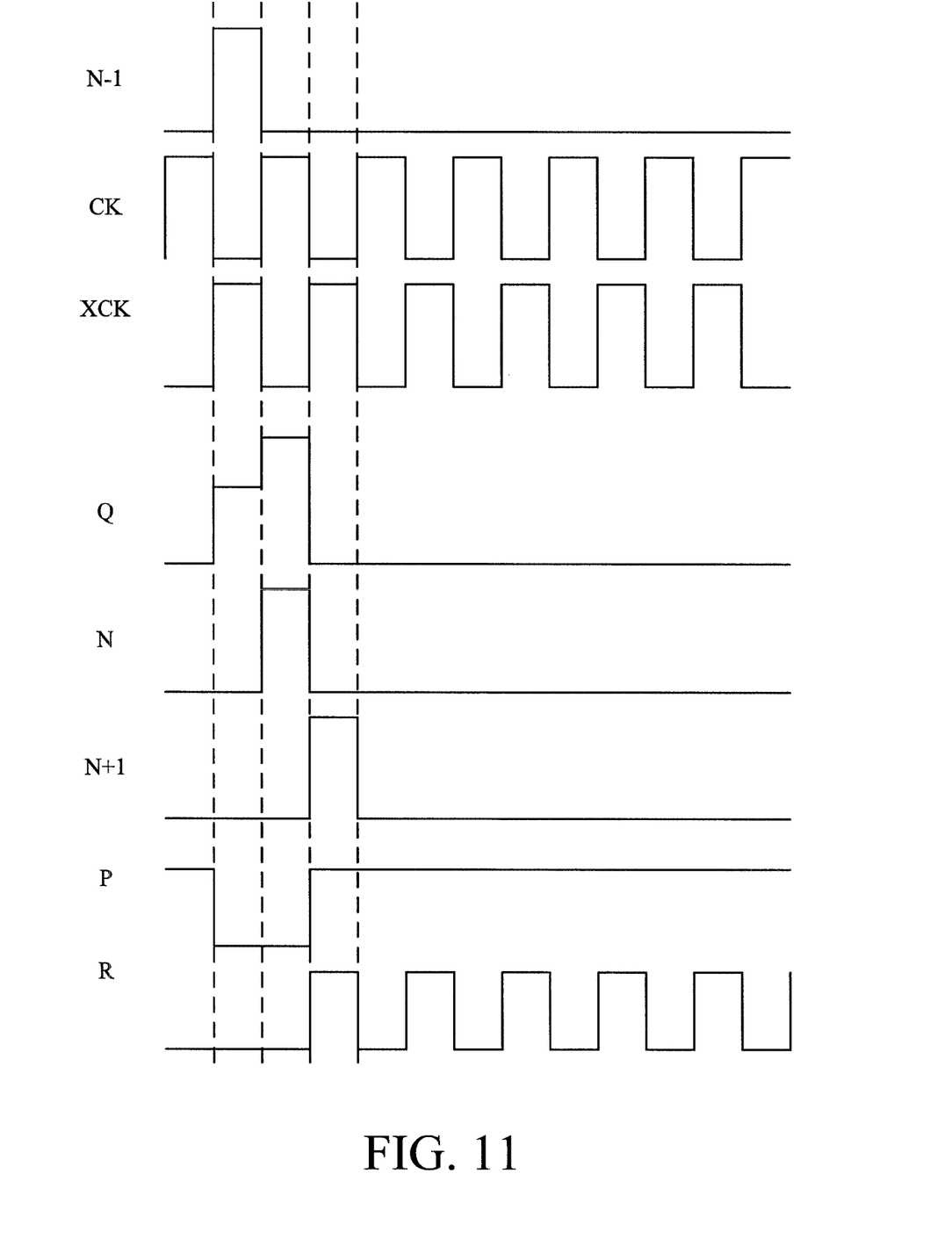
FIG. 11 is signal waveform diagram of each node in the shift register of FIG. 10.

FIG. 11 illustrates a signal waveform diagram of each node in the shift register 50 of FIG. 10. The node P can be kept in the high voltage level constantly by the charges stored in the equivalent capacitor $C_d$. The transistor T8 can be kept in a turn-on state to make the voltage level of the node R synchronized with the second clock signal XCK. Accordingly, the turn-on/turn-off state of the transistors T5 and T6 can be controlled for synchronously controlling the voltage levels of the gate and source of transistor T2. However, the transistors T4 and T9 are used to discharge the equivalent capacitor $C_d$ for turning off the transistor T8 when the driving signal N−1 is in the high voltage level.

Figure 12:
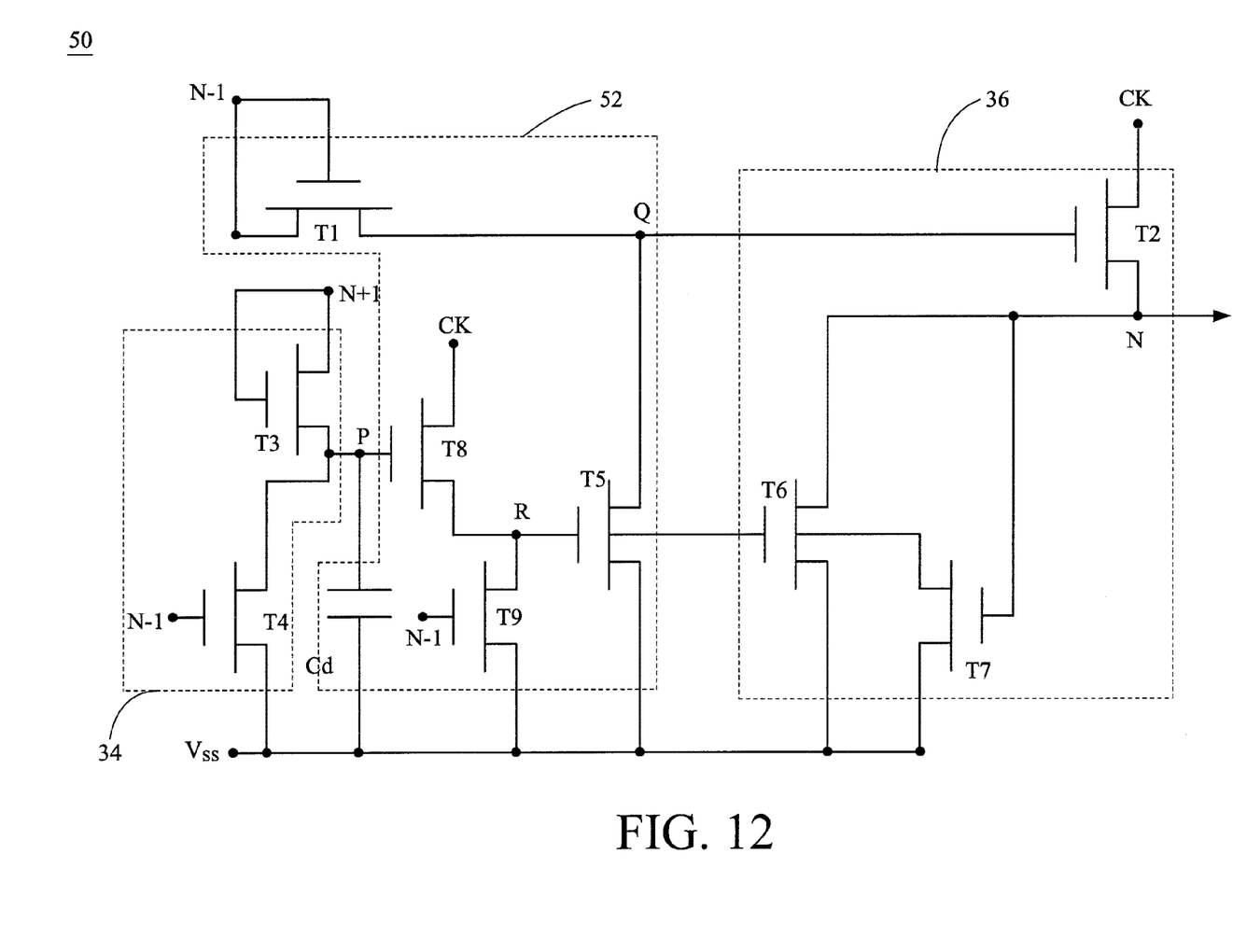
FIG. 12 is a circuit diagram of a still further embodiment of the shift register according to the present invention.

FIG. 12 illustrates a circuit diagram of a still further embodiment of the shift register according to the present invention. The difference between the embodiments in FIG. 12 and FIG. 10 is that the drain of transistor T8 in the shift register 50 is changed to receive the first clock signal CK.

Figure 13:
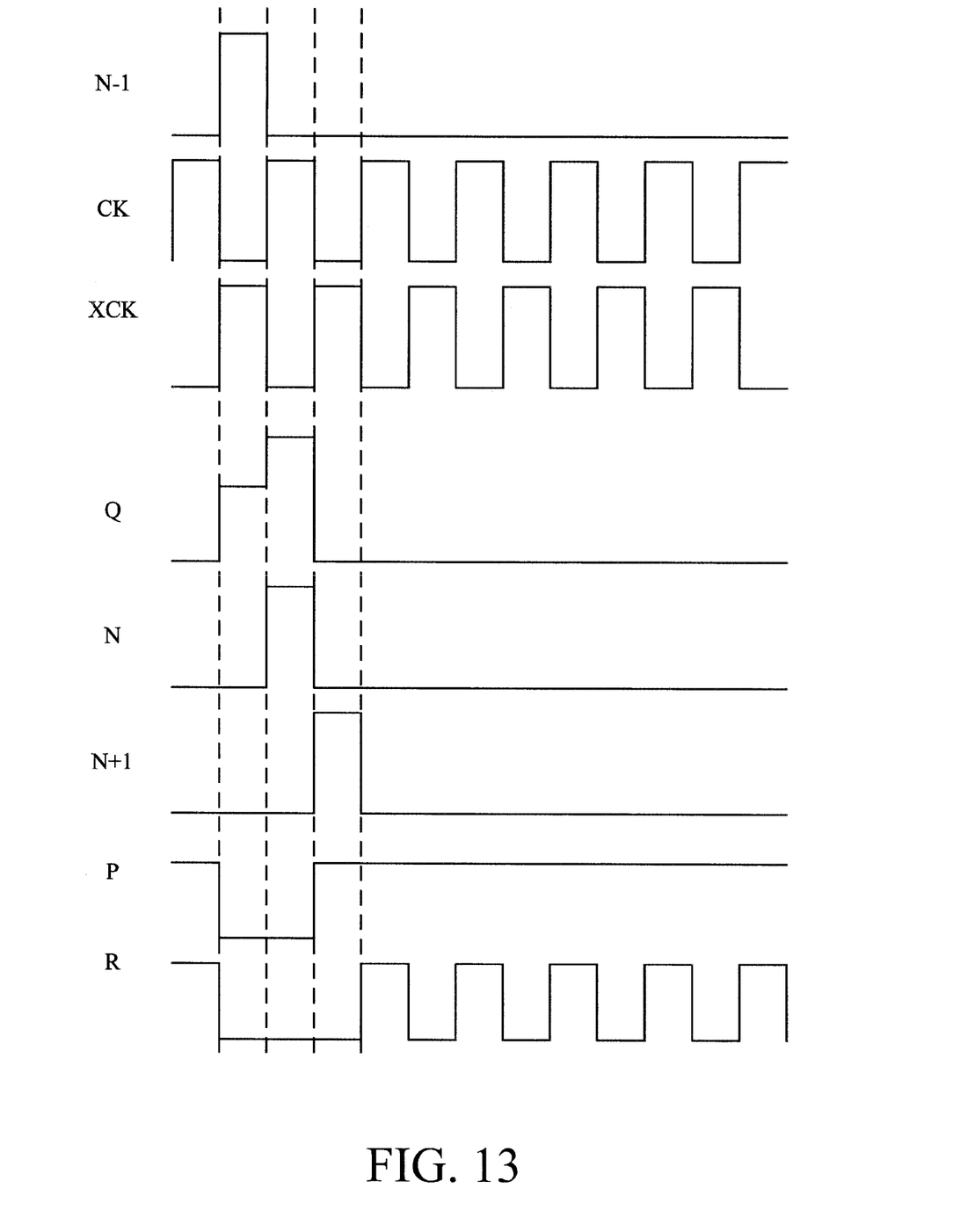
FIG. 13 is a signal waveform diagram of each node in the shift register of FIG. 12.

FIG. 13 illustrates a signal waveform diagram of each node in the shift register 50 of FIG. 12. The node P can be kept in the high voltage level constantly by the charges stored in the equivalent capacitor $C_d$. The transistor T8 can be kept in a turn-on state to make the voltage level of the node R synchronized with the first clock signal CK. Accordingly, the turn-on/turn-off state of the transistors T5 and T6 can be controlled for synchronously controlling the voltage levels of the gate and source of transistor T2. However, the transistors T4 and T9 are used to discharge the equivalent capacitor $C_d$ for turning off the transistor T8 when the driving signal N−1 is in the high voltage level.

It should be noted that an additional capacitor can be used in the shift register of the present invention to perform the same function as the parasitical capacitance of the transistor. The implementation of the equivalent capacitor $C_d$ can be varied in accordance with the requirements in practice.

Figure 14A:
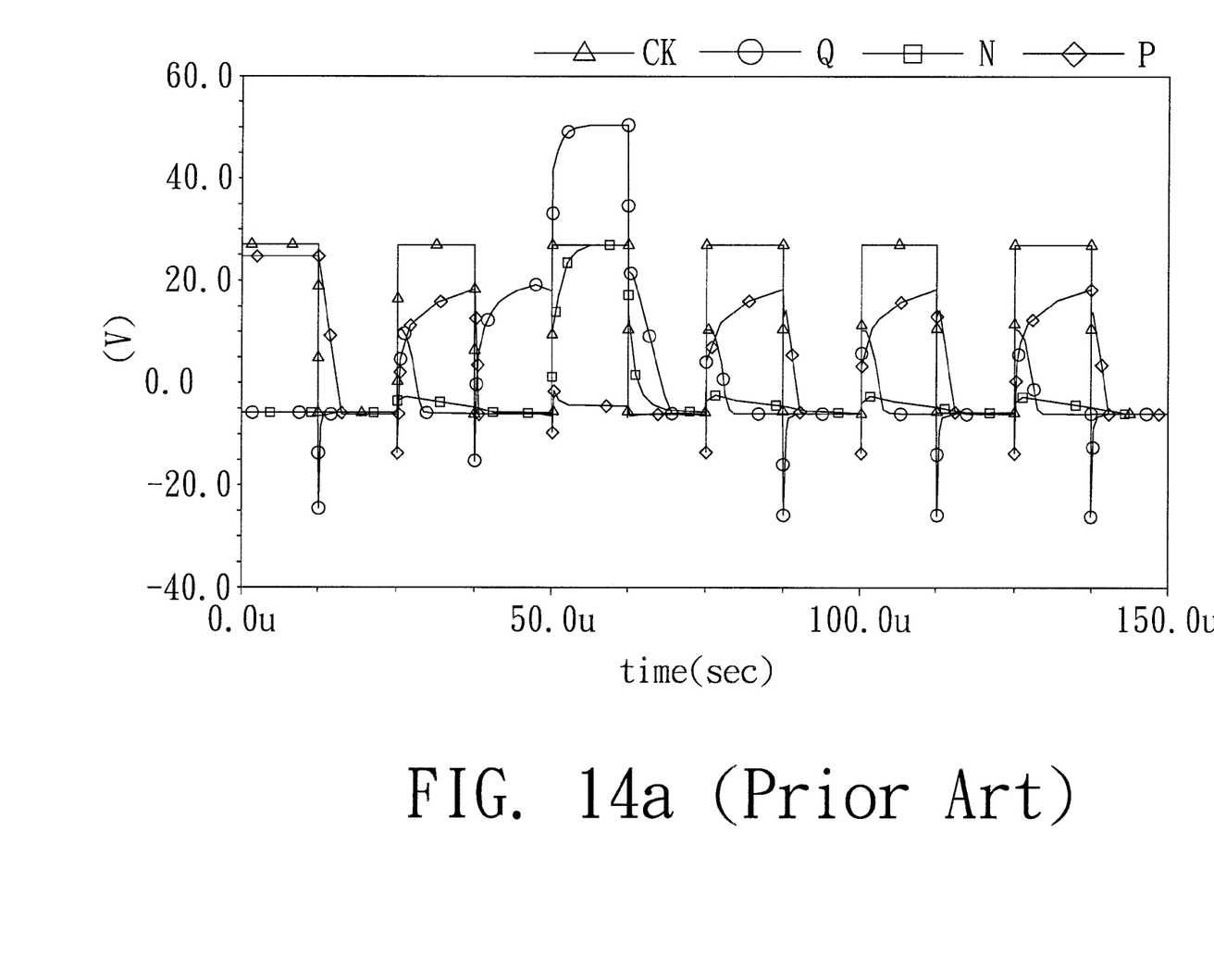
FIG. 14a is a signal response diagram of each node in the conventional shift register.
Figure 14B:
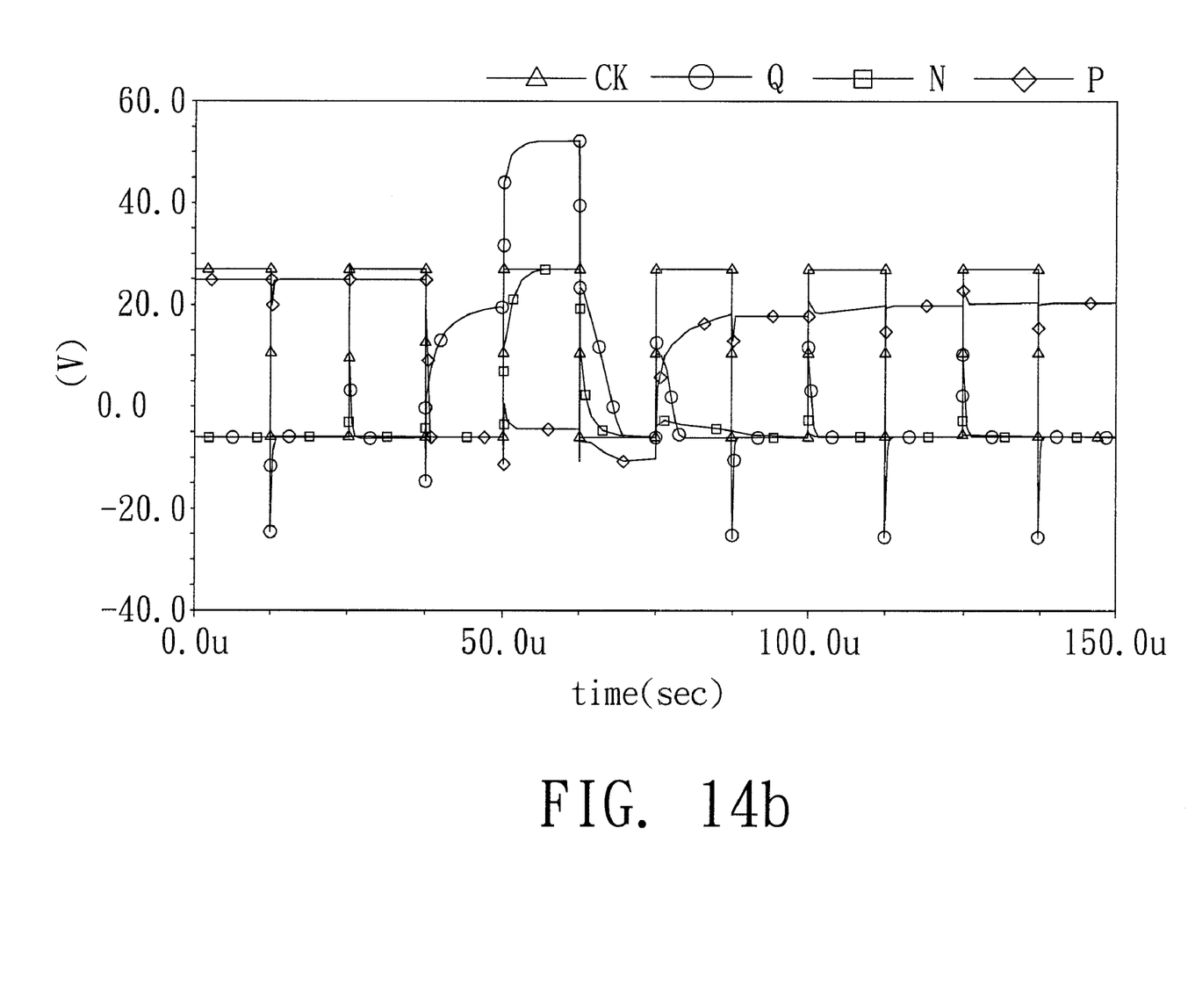
FIG. 14b is a signal response diagram of each node in the shift register of present invention.

Referring to FIGS. 14a and 14b, FIG. 14a is a signal response diagram of each node in the conventional shift register, and FIG. 14b is a signal response diagram of each node in the shift register of present invention. It is noted that the AC coupling of the driving signal N of stage N of the present invention is effectively improved, as compared with the conventional shift register. Furthermore, the voltage level of node P can be kept in the high voltage level by the charges stored in the equivalent capacitor.

According to the present invention, the resident charges of the transistor are used to decrease stress in transistors and the AC coupling of the driving signals. Moreover, the shift register in accordance with the present invention does not need to set an additional DC voltage source $V_{DD}$. Hence, the manufacturing costs can be reduced and the device performance can be improved.

As is understood by a person skilled in the art, the foregoing preferred embodiments of the present invention are illustrative rather than limiting of the present invention. It is intended that they cover various modifications and similar arrangements. Therefore, the scope of the appended claims and the spirit of the present invention should be accorded the broadest interpretation so as to encompass all such modifications and similar structure.

What is claimed is:

1. A shift register comprising:
  an output circuit (36), comprising:
    a first transistor (T2) for receiving a first clock signal and outputting a first driving signal; and
    a second transistor (T6) for pulling down a voltage level of an output end of the first transistor to a low voltage level when the first transistor does not output the first driving signal;
  a first switch circuit (52), comprising:
    a third transistor (T1) comprising a drain, a gate and a source, the drain and the gate of the third transistor being coupled to a second driving signal, the source of the third transistor being coupled to a control end of the first transistor;
    a fourth transistor (T5) comprising a gate and a drain, the gate of the fourth transistor being electrically connected with the second transistor, and the drain of the fourth transistor being electrically connected with the control end of the first transistor, for pulling down a voltage level of the control end of the first transistor to the low voltage level when the first transistor does not output the first driving signal; and
    a fifth transistor (T8) comprising a gate and a drain, the drain of the fifth transistor being coupled to a second clock signal, for receiving a first input signal for controlling the turn-on/turn-off states of the second and the fourth transistors; and
  a second switch circuit (34), comprising:
    a sixth transistor (T3) comprising a source, a gate and a drain, the gate and the drain being electrically connected to a second input signal, the source of the sixth transistor being electrically connected to the gate of the fifth transistor;
  wherein the second and the fourth transistors store charges in parasitical capacitor thereof by a voltage level of the second input signal for keeping the voltage levels of the gates of the second and the fourth transistors in a high voltage level, the second and the fourth transistors are kept in the turn-on state when the first transistor does not output the first driving signal.

2. The shift register of claim 1, wherein the second switch circuit further comprises a seventh transistor (T4) for turning off the second and the fourth transistors when the first transistor outputs the first driving signal.

3. The shift register of claim 1, wherein the low voltage level approaches a ground voltage.

* * * * *